United States Patent [19]
Ebert

[11] Patent Number: 6,110,280
[45] Date of Patent: Aug. 29, 2000

[54] TEMPERATURE CONTROLLED CHEMICAL DISPENSER

[75] Inventor: Andreas Ebert, La Grangeville, N.Y.

[73] Assignee: Fairchild Technologies USA, Inc., Dulles, Va.

[21] Appl. No.: 09/309,729

[22] Filed: May 11, 1999

Related U.S. Application Data

[62] Division of application No. 08/807,680, Feb. 27, 1997, Pat. No. 5,916,368.

[51] Int. Cl.$^7$ ..................................................... B05C 11/00
[52] U.S. Cl. .............................. 118/52; 118/69; 118/320; 427/240
[58] Field of Search .................................... 427/240, 385.5, 427/398.1; 118/52, 320, 305, 69; 437/231; 239/132

[56] References Cited

U.S. PATENT DOCUMENTS

| | | | |
|---|---|---|---|
| 4,609,037 | 9/1986 | Wheeler et al. | 165/61 |
| 4,889,069 | 12/1989 | Kawakami | 118/50 |
| 5,427,820 | 6/1995 | Biche | 427/240 |
| 5,580,607 | 12/1996 | Takekuma | 427/240 |

*Primary Examiner*—Shrive Beck
*Assistant Examiner*—Jennifer Calcagni
*Attorney, Agent, or Firm*—Martine Penilla & Kim, LLP

[57] ABSTRACT

Disclosed is a temperature controlled dispense arm for dispensing chemicals in a spin coating machine. The temperature controlled dispense arm has a cooling portion containing cooling coils and a dispense arm base having chemical dispense passages. The temperature controlled dispense arm maintains the chemical dispense passages at a cooled temperature as determined by the cooling coils located in the cooling portion.

18 Claims, 13 Drawing Sheets

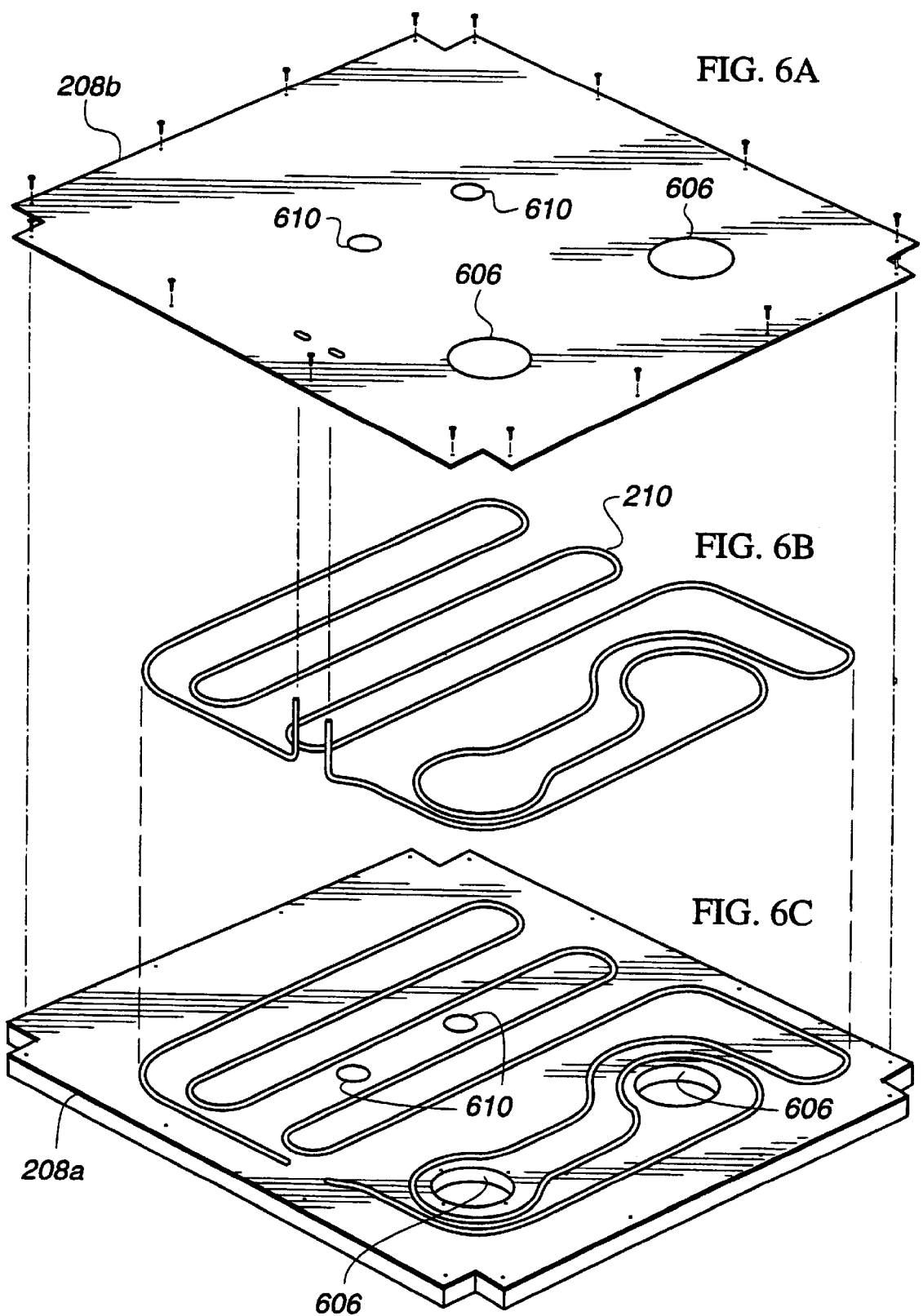

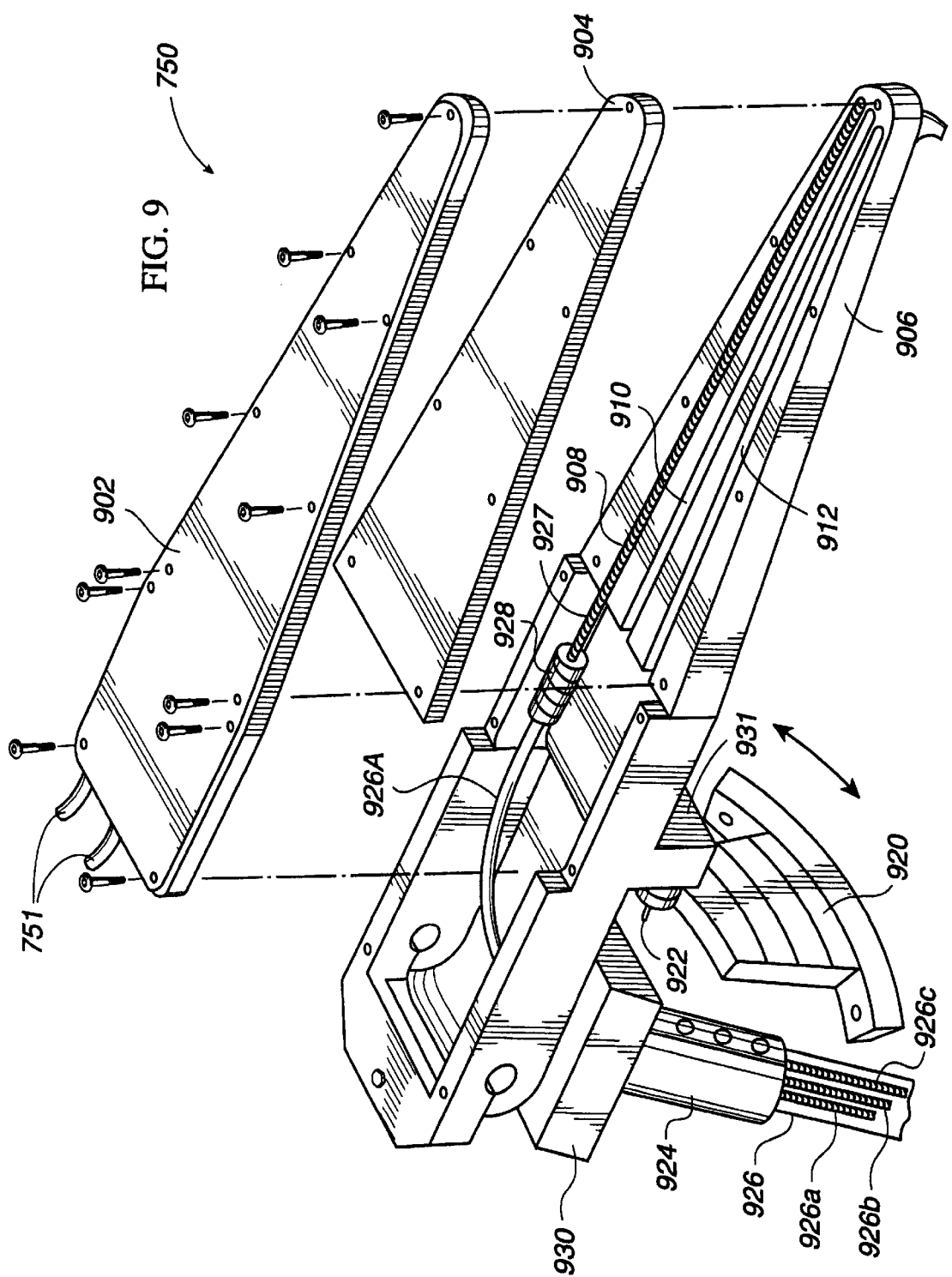

TEMPERATURE CONTROLLED CHEMICAL DISPENSER

This is a division of application Ser. No. 08/807,680, filed Feb. 27, 1997, now U.S. Pat. No. 5,916,368.

BACKGROUND OF THE INVENTION

1. Field of the Invention

The present invention relates generally to compact disc manufacturing, and more particularly, to methods and apparatuses for temperature controlled spin-coating systems.

2. Description of the Related Art

Compact disc recordable (CDR) technology has received increased popularity due to increased consumer demands for storage devices having large storage capacities and fast reading and writing capabilities. Generally, CDR discs are similar to well known read-only compact discs (CDs) used in the music recording industry and computer software industry. However, fabricating CDR discs requires various processing steps that are dissimilar to those employed by CD manufactures. Initially, CDR disc manufactures use well known molding machines that are configured to receive a polycarbonate (ie., plastic) material from one end and output a warm clear plastic disc at the other end. Once output from the molding machine, the discs are cooled and inspected for defects or abnormalities which may have been introduced during the molding process. If the polycarbonate disc meets quality control tolerances, the disc is moved to a chemical application station where a solvent based chemical is coated over the clear polycarbonate disc. Suitable well known solvent based chemicals may be obtained from CMR Technology, Inc., Trumble, Conn.

In "record once" recordable CDR technology, the solvent based chemical coated over the surface of the polycarbonate disc is a critical layer that typically defines the resulting performance ratings of recording and reading operations. The solvent based chemical generally acts as a programmable layer that changes characteristics when a recording laser is directed at the underside of the polycarbonate disc. Accordingly, during a subsequent reading operation, a reading laser is scanned across the disc and a sensor is able to distinguish recorded regions from non-recorded regions by examining the reflected light from the reading laser.

Nonuniformities in the chemical coating affect the reaction of the chemical coating to the reading laser. Therefore, the solvent based chemical applied over the polycarbonate disc must be extremely uniform in order to produce CDR discs that are sufficiently fast at both recording and subsequent reading operations. If the solvent based chemical is applied in a non-uniform manner over the surface of the polycarbonate disc, the recording and reading responses will suffer and therefore produce a slower recording and reading CDR disc.

As is well known in the art, CDR discs are classified and marketed as either 2X, 4X, 6X, 8X, etc., depending the CDR disc's recording speed. Although manufacturing costs associated with fabricating CDR discs having 2X, 4X, 6X, or 8X speeds are substantially equal, typical market prices for 2X discs are substantially lower than that of 8X discs. However, generating uniform chemical coatings over the surface of a polycarbonate disc has been found to be extremely challenging due to a number of factors, including increased temperatures generated in conventional spin-coating systems. By way of example, most commonly used spin-coating systems have chucks for holding discs in place while rotating the chuck at high revolutions per minute (RPMs). Of course, in order to rotate the chuck and disc at speeds suitable for spin-coating solvent based chemicals used in CDR technology, the mechanical friction and motors to rotate the chuck generate increased temperatures.

As CDR discs are spin coated in a manufacturing line where hundreds or thousands of discs are spin-coated one after another, the temperatures of the spin-coating systems may increase to temperatures reaching about 35 degrees ° C. Typically, when discs are placed over a chuck for spinning, the disc is only in contact with the chuck near the center radius where no information is written. The polycarbonate material which makes up the disc is a relatively good thermal insulator. Therefore, when a disc is placed in contact with the warm chuck, the disc will generally be warmer near the center radius and cooler near the edges. As a result, the solvent based chemical will be less viscous (i.e., thinner) near the center and more viscous (i.e., thicker) near the outer radius. The solvent also tends to be more viscous at the edge as a result of evaporation. Consequently, undesirable non-uniformities are introduced which degrade the quality of reading and writing operations.

FIG. 1 is a cross-sectional view of a CDR disc having non-nonuniformities believed to be caused in part by elevated temperatures in conventional spin coating systems. In this example, a disc 32 is shown having various chemical layers applied over the disc's surface. As described above, a solvent based chemical 36 is initially applied near an inner radius of the disc 32 in order to spread the chemical over the top surface of the disc once the disc is rotated to equilibrium speeds. As shown, the applied solvent based chemical 36 has a wavy top surface having a thinner profile near the radius and a thicker profile near the outer radius.

As illustrated, when the center of the disc 32 has a higher temperature, the solvent based chemical 36 is will be less viscous and therefore exhibit a thinner profile 36b. Conversely, the outer radius of the disc 32 will have a lower temperature because it is not in contact with the chuck. As a result, the solvent based chemical will be more viscous and have a thicker profile 36a.

Once the solvent based chemical 36 is applied over disc 32, disc 32 is removed from the spin coating system and placed into a sputtering machine where a gold material 38 is sputtered over solvent based chemical 36. Although the gold material 38 may have a more uniform profile throughout the disc surface, the non-nonuniformities of the underlying solvent based chemical 36 unfortunately mirror up. Once the gold material is sputtered on, the disc 16 is moved to another station where a suitable protective lacquer coating 40 is applied over the gold layer 38 and solvent based chemical 36. As is well known in the art, protective lacquer coating 40 serves to seal the various layers from ambient conditions and prolongs a CDR's useful life.

Once the lacquer coating 40 is applied, the disc 16 is placed into an ultraviolet curing station where lacquer coating 40 is appropriately hardened. At this point, the core CDR fabrication steps are complete and the CDR disc may then be recorded with suitable information using a recording head 46 that applies a recording laser beam 48 to an under surface of the CDR disc. During recording, the recording laser beam 48 reacts with solvent based chemical 36 which changes the chemical properties of solvent based chemical 36. As a result, the changed chemical properties produce a recorded spot 35 which identifies a recorded event. Of course, it should be appreciated that the non-uniform wavy characteristics of solvent based chemical 36 may detrimentally affect recording and reading speeds which consequently impact a CDR disc's value.

In view of the foregoing, there is a need for methods and apparatuses for controlling the viscosity of the chemical during spin-coating process to reduce non-nonuniformities in coatings which have changing viscosity as a result of temperature variation and evaporation.

SUMMARY OF THE INVENTION

Broadly speaking, the present invention fills these needs by providing methods and apparatuses for uniformly spin-coating chemicals over uniformity and precision sensitive CDR discs. In addition, the present invention controls the evaporation of the solvent component in solvent based chemicals through the precise temperature controlling features of the present invention. It should be appreciated that the present invention can be implemented in numerous ways, including as a process, an apparatus, a system, a device, or a method. Several inventive embodiments of the present invention are described below.

In one embodiment, a method of distributing a chemical over the surface of a substrate is disclosed. The method includes depositing the chemical on a portion of the surface of a substrate near the center of the substrate. The method further includes controlling the temperature of the surface of a substrate so that the viscosity of the chemical is calibrated to cause the chemical to be deposited on the surface of the substrate in a substantially uniform manner.

In a further embodiment, the substrate may be placed in contact with a cooled chuck that is in the vicinity of a cooled mounting plate having a network of cooling coils. Advantageously, any heat generated by mechanical friction and motors used to spin a spin coating apparatus is controlled to ensure that the chemical applied to the surface of the substrate results in a substantially uniform layer.

In yet a further embodiment, a temperature controlled dispense arm is implemented to ensure that the temperature of the chemicals being applied to the surface of a substrate are maintained at optimum process temperature during application. The temperature controlled dispense arm is also preferably suited to dispense a plurality of chemicals that may include a primary chemical, a test chemical and a cleaner.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIGS. 6A, 6B and 6C illustrate an exploded diagram of the mounting plate in accordance with one embodiment of the present invention.

FIG. 9 is an exploded diagram of a temperature controlled dispense arm 750 in accordance with one embodiment of the present invention.

DETAILED DESCRIPTION OF THE PREFERRED EMBODIMENTS

An invention is disclosed for methods and apparatuses for temperature controlled spin-coating systems. In the following description, numerous specific details are set forth in order to provide a thorough understanding of the present invention. It will be obvious, however, to one skilled in the art, that the present invention may be practiced without some or all of these specific details. In other instances, well known process operations have not been described in detail in order not to unnecessarily obscure the present invention.

Figure 2:
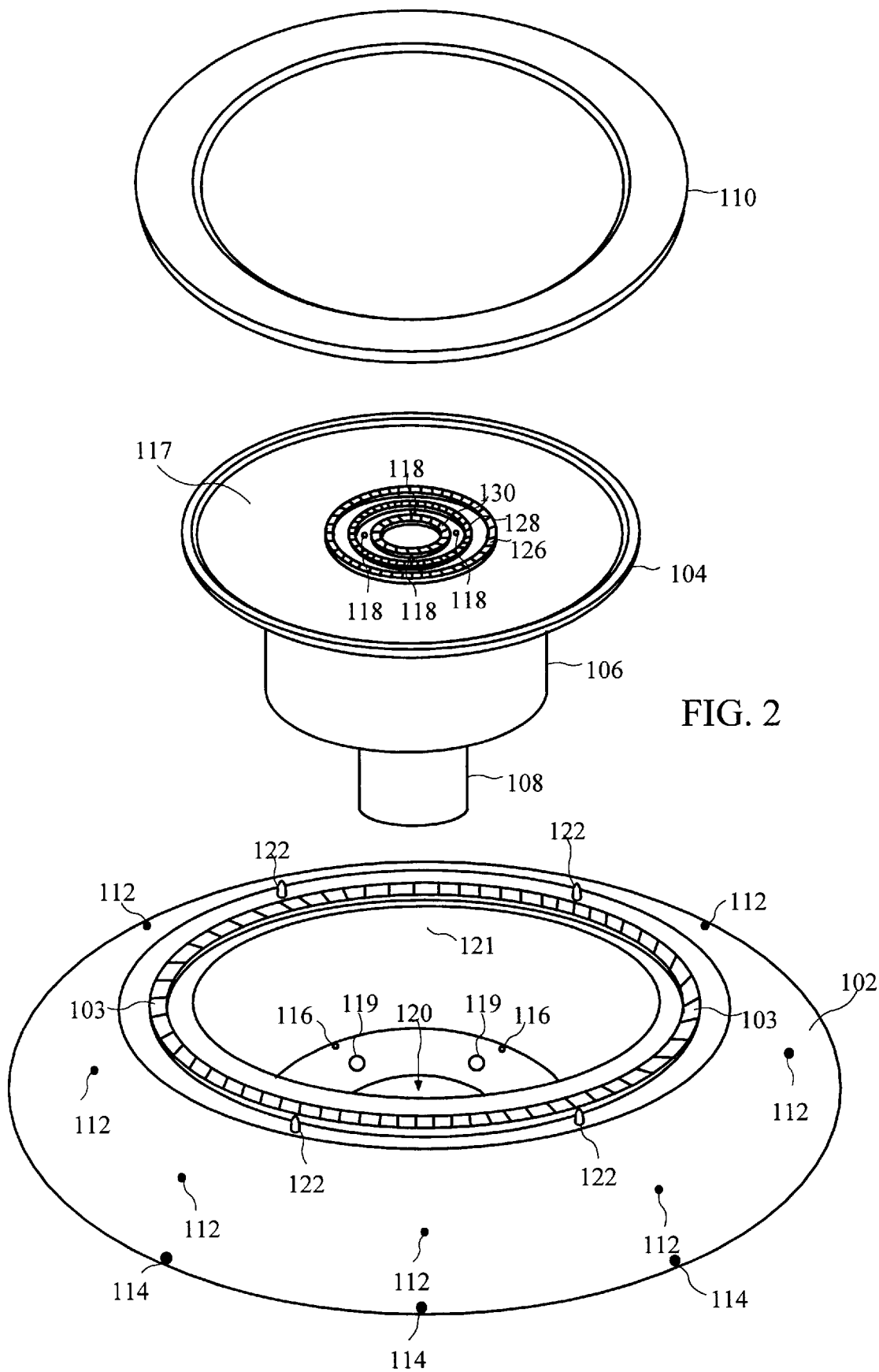
FIG. 2 is an exploded view of a spinning bowl including an internal chuck and a lid in accordance with one embodiment of the present invention.

It should be understood that the temperature controlling embodiments of the present invention may be practiced using any spin-coating system which may include "open" and "closed" bowl arrangements. For ease of description, FIG. 2 illustrates a closed bowl arrangement which is disclosed in U.S. patent application Ser. No. 08/797,819 filed on Feb. 7, 1997, now U.S. Pat. No. 5,840,365, naming Andreas Ebert and Abdul Ghafar, and entitled "Method and Apparatus for Spin-Coating Compact Discs." This application is hereby incorporated by reference.

FIG. 2 is an exploded view of a spinning bowl including an internal chuck and a lid. A spinning bowl 102 is shown as a circular bowl having a hollow internal region that is accessible through a top opening. In this embodiment, a chuck base 106 and a shaft 108 are placed into and fixedly attached to an internal base region 121 of spinning bowl 102. By way of example, shaft 108 is passed through a chuck receiving hole 120 located at internal base region 121 where a chuck base 106 is securely attached to spinning bowl 102. Although any suitable attaching method may be implemented, conventional screws (now shown) passed through a set of receiving holes 119 may be used to secure chuck base 106 to spinning bowl 102.

Finally, a chuck plate 104 that is preferably integrally connected to chuck base 106 is provided for holding a suitable work piece. In a preferred embodiment, the work piece is a polycarbonate disc used in the compact disc (CD) and compact disc recordable (CDR) industries. However, it should be appreciated that the various embodiments of the present invention may be equally applicable to other semiconductor technologies where precision chemical (i.e., resist, spin on glass, etc.) spin-coating is desirable.

As shown, chuck plate 104 preferably has a top surface region 117 that is configured to hold a suitable polycarbonate disc. Generally, top surface region 117 includes three supporting rings near a center radius of chuck plate 104 that are used to hold a disc in a manner that protects the disc's under surface from coming into contact with top surface region 117 of chuck plate 104.

By way of example, typical polycarbonate discs include a molded protruded ring near an inner radius of its under surface. This protruded ring is generally configured to mate with the various complementary protruded rings provided as part of chuck plate 104. In this example, chuck plate 104 includes an inner protruded ring 130, a middle protruded ring 128, and an outer protruded ring 126. Thus, when a polycarbonate disc having a protruded ring is placed over chuck plate 104, the protruded ring on the polycarbonate disc may preferably sit between middle protruded ring 128 and outer protruded ring 126. In this manner, sensitive portions of the polycarbonate disc are maintained slightly above and apart from top surface region 117. However, when the temperature of chuck plate 104 increases, the temperate of the inner radius of a disc will also increase.

Once chuck plate 104, chuck base 106, and rotation rod 108 are inserted into chuck receiving hole 120 of spinning bowl 102, a lid 110 may be placed over spinning bowl 102 to encapsulate chuck plate 104 and chuck base 106 within spinning bowl 102. In this example, lid 110 will preferably have a circular recessed groove at its under portion (not shown for ease of explanation) which will preferably mate with a circular protruded lip 103 located at a topmost region near an opening of spinning bowl 102.

Preferably, spinning bowl 102 has a base region which is at a slight incline and wall regions which are curved and inclined at an angle towards the center of spinning bowl 102. As illustrated, spinning bowl 102 therefore resembles a saucer shape that includes curved angled walls. Further, a plurality of floor drain holes 116 are useful in draining any excess chemicals during a spin coating process. To ensure that lid 110 remains attached to spinning bowl 102, a plurality of pins 122 arranged about the top portion of spinning bowl 102. Generally, pins 122 will appropriately mate with suitable recessed pin holes located at an under surface of lid 110. In yet a further embodiment, lid 110 may include a center pin (not shown) which preferably inserts down into a center top portion of chuck plate 104.

Spinning bowl 102 also includes a plurality of upper vent holes 112 arranged about a midway point of the side walls of spinning bowl 102. Further shown are a plurality of venting drain holes 114 arranged about an outer lower region of the side walls of spinning bowl 102. Generally, venting drain holes 114 are defined near a radial distance (i.e., from the center) where the curved walls of spinning bowl 102 integrally meet a base region of spinning bowl 102. It should be appreciated that upper vent holes 112 are preferably located at radial distance that is less than the radial distance of venting drain holes 114. In this embodiment, venting drain holes 114 are slightly larger in diameter than the upper vent holes 112 to ensures that a pathway sufficient for both ventilation and drainage is available.

Figure 3A:
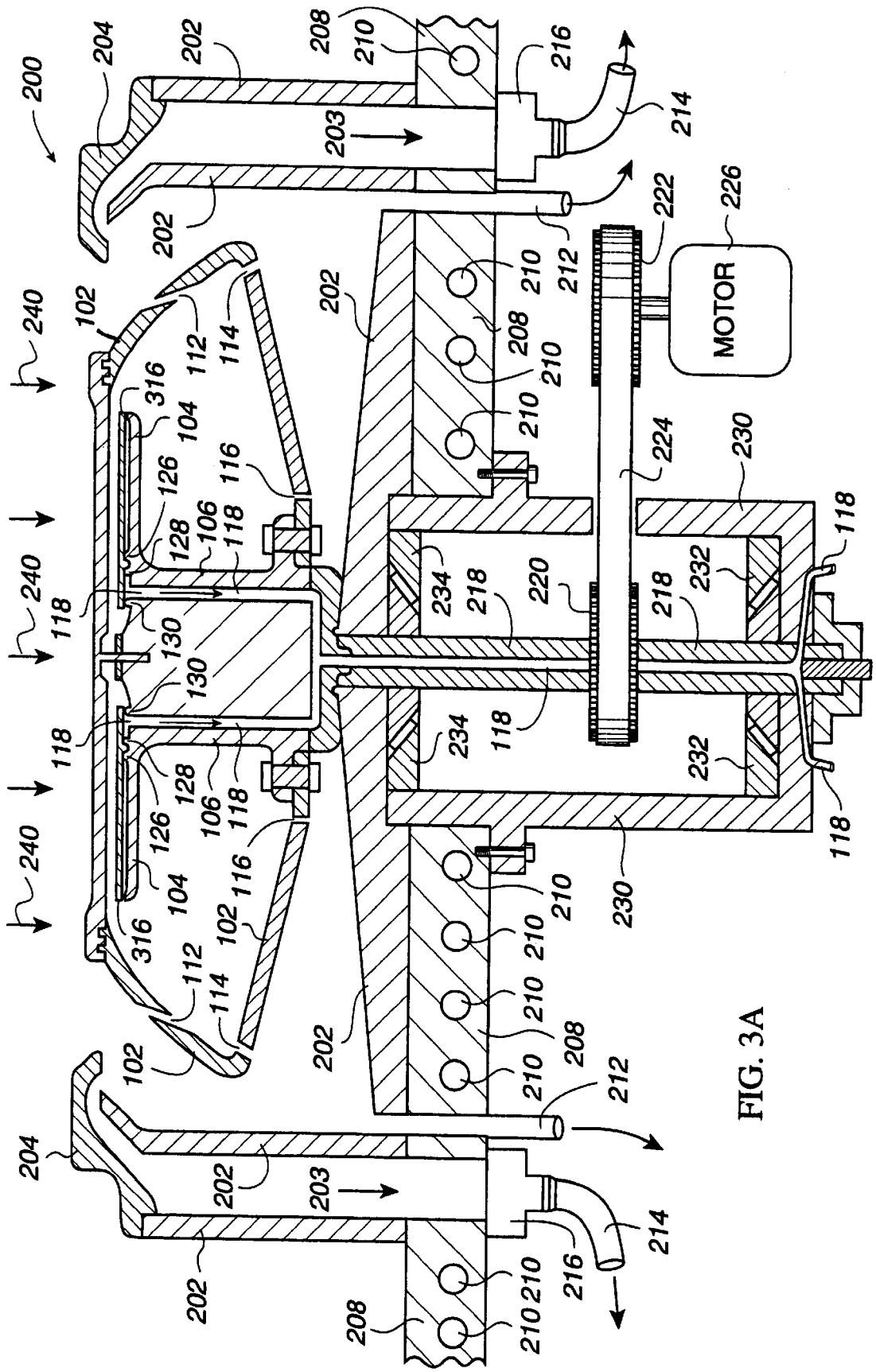
FIG. 3A is a cross-sectional view of a process station in accordance with one embodiment of the present invention.

FIG. 3A is a cross-sectional view of a process station 200 in accordance with one embodiment of the present invention. As shown, spinning bowl 102 is mounted within a process bowl 202 that surrounds spinning bowl 102 in a circular manner. In a preferred embodiment, process bowl is manufactured from an aluminum material. However, it should be understood that other metals or alloys may be substituted therefor. Process bowl 202 is preferably a single unit having a base portion that lies below spinning bowl 102. Further, process bowl is preferably in direct contact with and mounted on a mounting plate 208. As will be described in greater detail below, mounting plate 208 is preferably a temperature controlled aluminum plate having a network of cooling coils 210. In this manner, heat generated by a motor 226 and related mechanical friction is dissipated and the temperature is controlled to improve the uniformity (e.g., reduce viscosity variations ) of chemicals applied within spinning bowl 102.

Process bowl 202 may also include a splash ring 204 that surrounds a top ridge of process bowl 202 to prevent chemicals being output from venting drain holes 114 from dispersing out of the process station 200. As described above, spinning bowl 102 is preferably coupled to shaft 218 which directly mounts to chuck 106. Shaft 218 therefore extends in a downward direction into a shaft housing 230 which holds a driven sprocket 220. Accordingly, shaft 218 spans the vertical distance of shaft housing 230. In this embodiment, shaft 218 preferably includes a hollow vacuum channel 118 that extends up into chuck 106 and up to an under surface of disc 316. In general, the vacuum generated through the vacuum assists in securing disk 316 to chuck plate 104 during a spinning operation.

Accordingly, the vacuum channel 118 may be split into a pair of vacuum channels 118 that are shown exiting shaft housing 230. In this manner, the vacuum channels 118 may be connected to a suitable vacuum device. In this embodiment, shaft 108 preferably rotates about a pair of upper and lower bearings 234 and 232 contained within shaft housing 230. Driven sprocket 220 contained within shaft housing 230 is also shown connected to a driving sprocket 222 which is connected to motor 226. In this manner, a belt 224 causes driven sprocket 220 to rotate upon the rotation of driving sprocket 220 which is turned by motor 226. Motor 226 may be any motor capable of driving sprocket driven belt. By way of example, motor 226 may be a 3.5 horse power Servo motor.

During a spin coating operation, the solvent based chemical is preferably applied to the inner radius of the top surface of disc 316 before lid 110 is secured to the top of spinning bowl 102. In one embodiment, motor 226 preferably rotates spinning bowl 102 to process equilibrium speeds which may be between about 3,000 rpms and about 10,000 rpms, and more preferably, between about 5,000 rpms and 8,500 rpms, and most preferably, about 7,000 rpms.

As the spin-coating process proceeds, excess solvent based chemical may be output from venting drain holes 114 of spinning bowl 102 which then caused the solvent based chemical to fall on the lower surface and walls of process bowl 202. Because the solvent based chemical may be a very expensive chemical re-using or recycling of such chemical would be advantageous. To accomplish such recycling, excess chemicals are drained out through suitable pipes 212 that are channeled to a suitable receptacle for holding the excess chemicals. Because part of the solvent component of the solvent based chemical evaporates into a vapor form during the coating process, the vapors are preferably pumped away from the process area through a channel 203 lying between the inner and outer walls of process bowl 202.

Channel 203 is therefore coupled to a manifold 216 that may be connected to a flexible pipe 214 for safely diverting such process vapors away from the processing area. Although manifolds 216 appears to be rectangular in shape in this cross-sectional view, it should be appreciated that manifold 216 is preferably a circular manifold attached to an under surface of mounting plate 208. To further assure that vapor chemicals are safely diverted from the process station 200, a flow of air pictorially illustrated by flow lines 240 are shown directing air in a downward direction at process station 200. Once the ambient air is directed downward towards process station 200, the air and process vapors are preferably diverted through channels 203 and out through pipes 214.

Figure 3B:
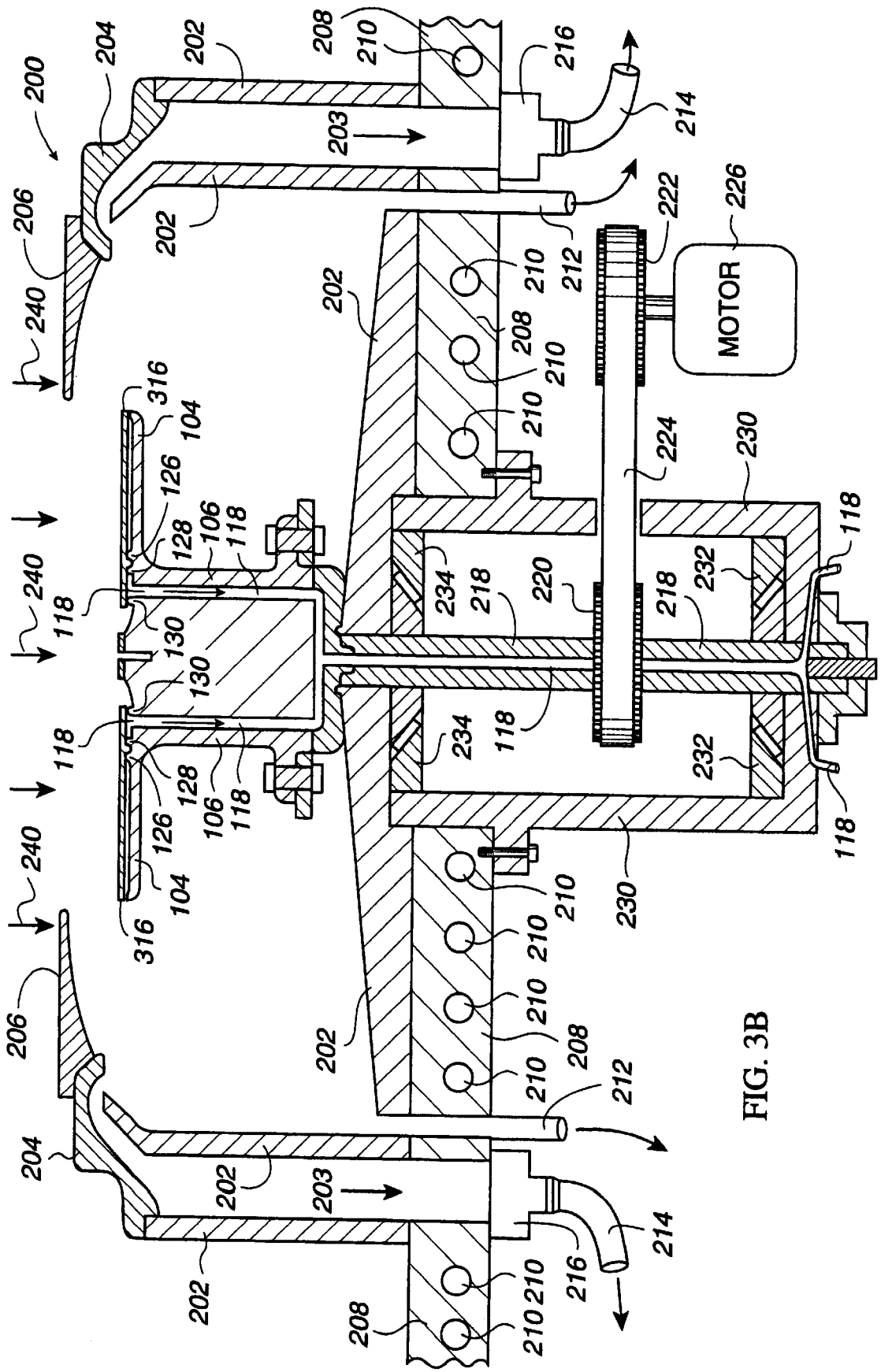
FIG. 3B is a cross-sectional view of a process station for an "open bowl" process in accordance with one embodiment of the present invention.

FIG. 3B is a cross-sectional view of a process station 200 for an "open bowl" process in accordance with one embodiment of the present invention. In this embodiment, a second circular splash ring 206 is placed over splash ring 204 to further ensure that chemicals being applied in the open bowl process are contained within process bowl 202. To create an open bowl process station, spinning bowl 102 of FIG. 2 is simply detached from chuck 106 at a lower portion. However, it should be appreciated that the heat generated by motor 226 as well as the rotational friction during operation is still conducted up to discs placed over chuck plate 104.

Advantageously, the cooling coils 210 assist in cooling mounting plate 208 to a temperature that is slightly below room temperature. By maintaining mounting plate 208 to this lower temperature, the temperature of chuck 106 as well as chuck plate 104 is reduced to slightly below room temperature. As a result, the temperature of the inner radius of a disc placed in contact with chuck plate 104 is also reduced. Therefore, it should be appreciated that the temperature controlling features of the present embodiment applicable to both an open and a closed bowl spin-coating process.

Figure 4:
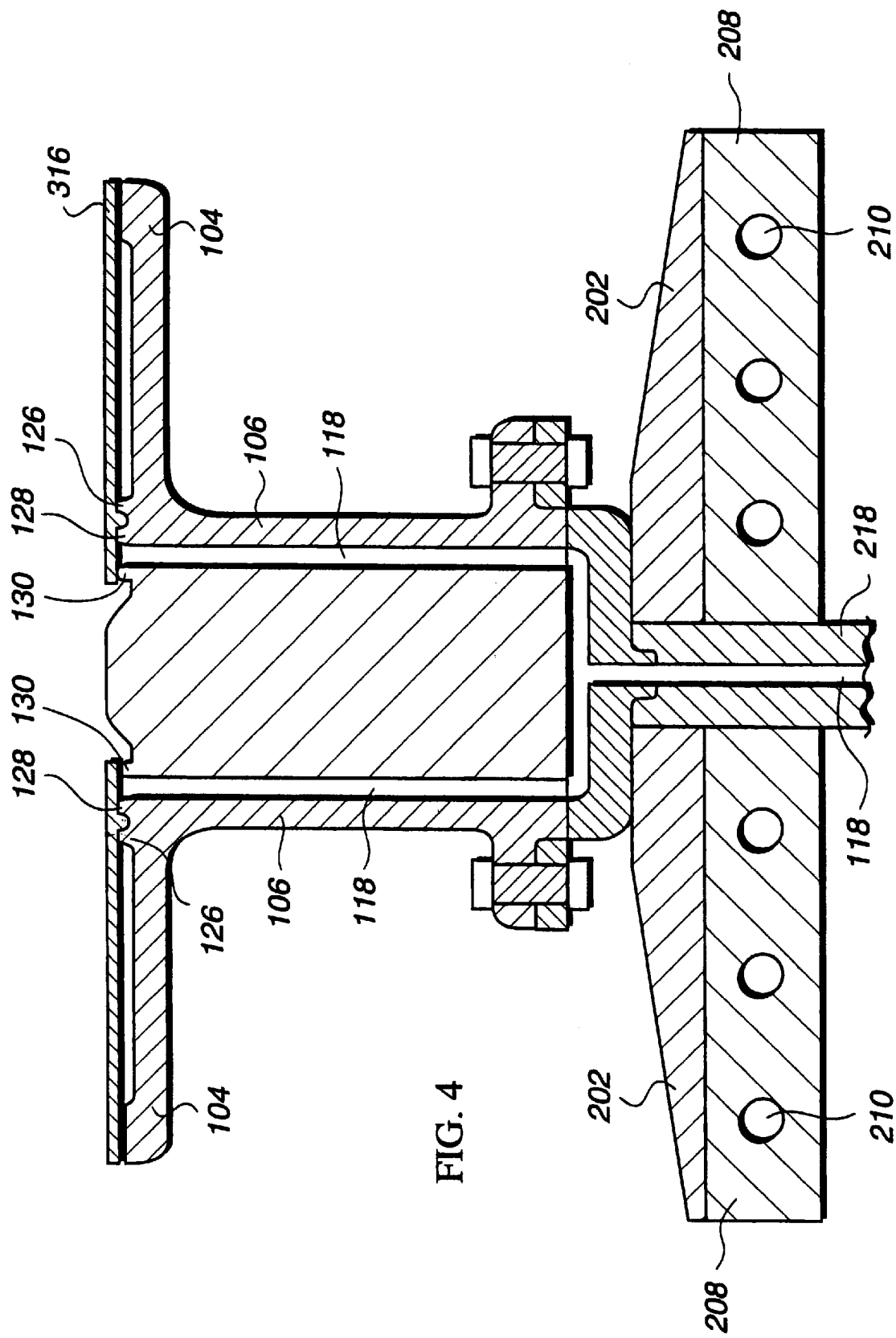
FIG. 4 is a more detailed illustration of a base region of the process bowl that is shown in direct contact with the mounting plate in accordance with one embodiment of the present invention.

FIG. 4 is a more detailed illustration of a base region of process bowl 202 that is shown in direct contact with mounting plate 208 in accordance with one embodiment of the present invention. As shown, shaft 108 is directly coupled to a lowermost portion of chuck 106. As described above, the heat transfer from a warmer process bowl 202 to a temperature controlled mounting plate 208 preferably assists in removing thickness variations of chemical applied over disc 316. By way of example, during full rotational operation, it is believed that the temperature of chuck 106 may reach temperatures close to about 35° C. after a number of discs are spin-coated.

In accordance with one embodiment of the present invention, the disc lying over chuck plate 104 will preferably have a cooler temperature near the inner radius where the disc is in contact with chuck plate 104. Preferably, the temperature of the inner radius may be between about 17° C. and about 20° C., and the outer radius of the disc may increase up to about room temperature (i.e., about 22° C.). To transfer this lower temperature to the inner radius of the disc, the mounting plate 208 is cooled to a temperature of between about 16° C. and about 20° C. with the aforementioned network of cooling coils 210. In one embodiment, cool fluids are preferably circulated through the mounting plate 208 and a refrigerating system. Of course, the provided temperature ranges are merely exemplary and the applied temperature ranges may vary depending on the parameters of the process.

To elaborate further, chuck 106 lies in direct contact with shaft 108 which is surrounded by the cooled mounting plate 208. Further, mounting plate 208 is preferably a large enough plate that its size and magnitude assists in absorbing the heat generated in process station 200. As shown in FIGS. 3A and 3B above, shaft housing as well as motor 226, generate heat which is advantageously dissipated by the network of cooling coils contained within mounting plate 208.

Figure 5A:
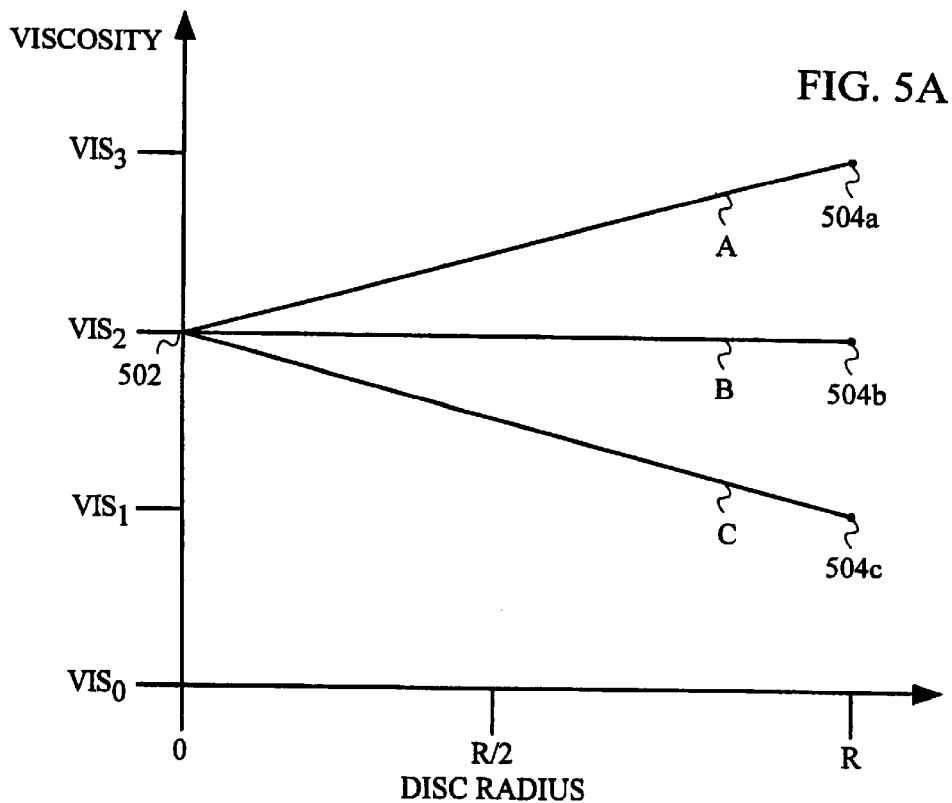
FIGS. 5A and 5B are solvent viscosity versus disc radius, and disc temperature versus disc radius graphs in accordance with one embodiment of the present invention.
Figure 5B:
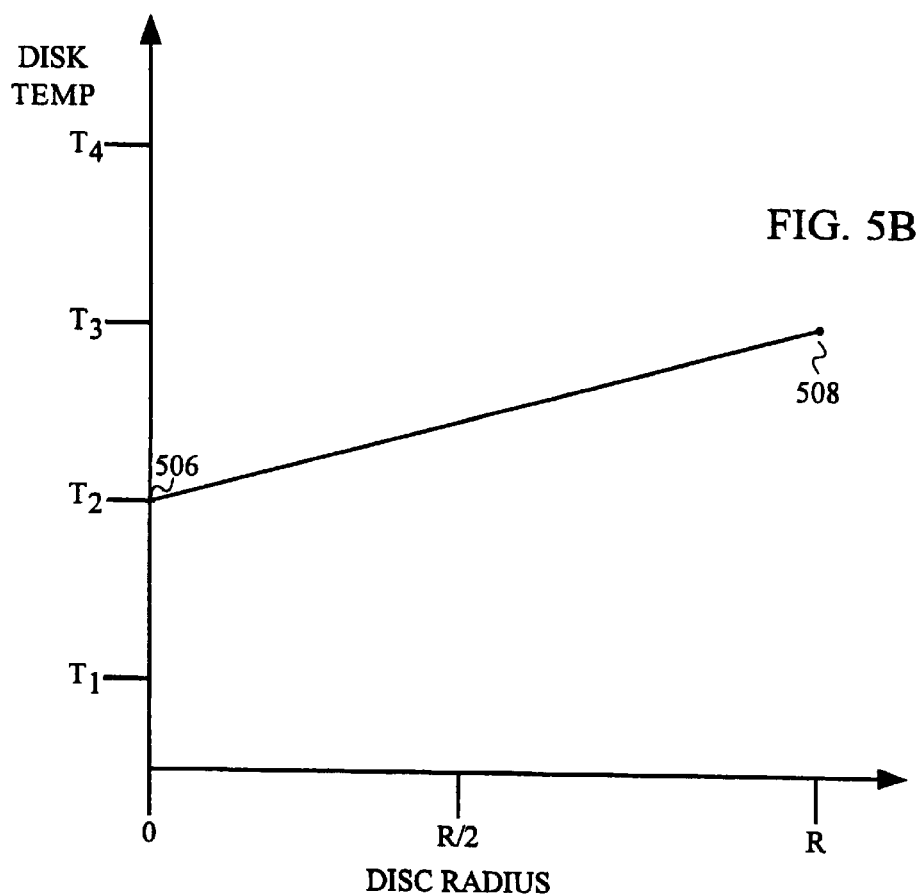

FIGS. 5A and 5B are solvent viscosity versus disc radius, and disc temperature versus disc radius graphs in accordance with one embodiment of the present invention. It should be borne in mind that disc 316 is in direct contact with chuck plate 104 at an inner radius of disc 316. In other words, disc 316 is in contact with chuck plate 104 near the inner radius where the temperature of chuck plate 104 is controlled by the network of cooling coils 210 in mounting plate 208. As a result, during an equilibrium spin-coating state, disc 316 itself has a cooler temperature near an inner radius 506 which increases to about room temperature near an outer radius 508 as illustrated in FIG. 5B.

Figure 1:
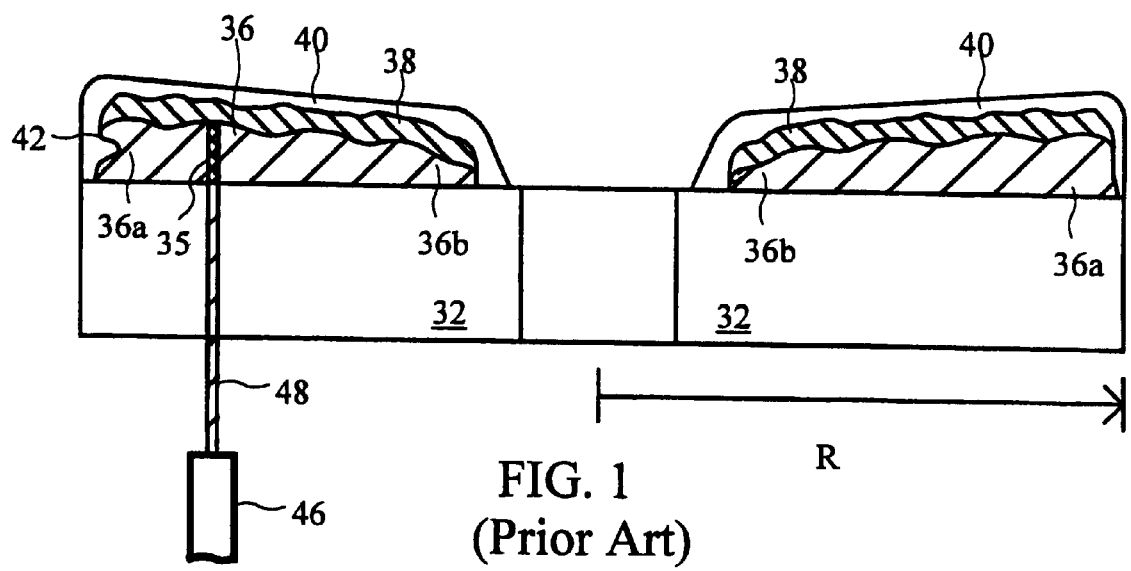
FIG. 1 is a cross-sectional view of a disc spin coated using conventional methods.

As will be described with reference to FIG. 5A, the increasing (i.e., from the inner radius to the outer radius) temperature variation caused on disc 316 is a beneficial aspect when applying the solvent based chemical over disc 316. By way of example, a line "A" illustrates a case where the usual amount of "solvent component" evaporates from the surface of disc 316 and the center of the disc is not cooled. As the solvent based chemical migrates from the center of the disc to the edge, the solvent component evaporates, causing the solvent based chemical to become more viscous. As a result, the viscosity of the solvent based chemical tends to increase from a point 502 (Vis$_2$) to about a point 504a (Vis$_3$). When this happens, the thickness of the applied chemicals will tend to be greater near the outer radius as shown in FIG. 1.

To avoid this problem, in one embodiment, the present invention causes the solvent based chemical to be cooler near the center of the disc and warmer near the edges so that the tendency of the solvent based chemical viscosity to decrease with higher temperature substantially cancels the tendency of the solvent based chemical to increase as a result of evaporation. The aforementioned cooling network contained within mounting plate 208 is implemented to cool the disc at its center. Because the polycarbonate disc is a relatively good thermal insulator, the temperature near the outside of the disc remains high when the center of the disc is cooled. By way of example, line "C" illustrates for a fluid which does not evaporate as it migrates outward, thus lowering of the viscosity of the fluid in contact with the disc surface when the inner radial region of the disc is cooler than the outer radial region of the disc. Thus, the viscosity decreases from a point (Vis$_2$) to a point (Vis$_1$) at an outer radius point 504c of the disc where the temperature is warmer than the inner cooled radius, in one embodiment, the outer radius of the disc 316 is preferably at about room temperature (i.e. about 22° C.) and the inner radius of the disc 316 is at a temperature that is slightly below room temperature (ie., about 18–20° C.).

Advantageously, when the inner radius of the disc 316 is cooled as described above, the resulting viscosity over the surface of disc 316 is believed to be substantially uniform as shown by line "B". The tendency of the solvent based chemical's viscosity to increase as a result of evaporation near the outer edge of the disc is substantially canceled by the tendency of the solvent based chemical's viscosity to decrease as a result of increasing temperature near the outer edge of the disc. Accordingly, the viscosity is shown being at about (Vis$_2$) from between point 502 to about a point 504b. (It should be noted that the graphs in FIGS. 5A and 5B both extend from zero radius to the disc radius R. Of course, in most CD applications, there is a hole in the center of the disc. It will be appreciated that the above analysis does not change in such applications where the solvent based chemical is applied at a point near the center instead of the center).

FIGS. 6A through 6C illustrate an exploded diagram of mounting plate 208 in accordance with one embodiment of the present invention. For ease of illustration, a in bottom plate 208b is shown in FIG. 6A. That is, thin bottom plate 208b is preferably the surface that underlies process station 200 of FIGS. 3A and 3B. In one embodiment, thin bottom plate 208b is preferably a thin aluminum sheet that covers a network of copper piping that makes up cooling coils 210 shown in FIG. 6B. Preferably, cooling coils 210 are inset into grooves defined within a thicker top plate 208a. As shown, thin bottom plate 208b preferably includes a pair of process station holes 606 and a pair of dispense arm holes 610 that suited to match up with complementary holes 606 and 610 contained on thicker top plate 208a.

Once assembled, thicker bottom plate 208b will define the internal roof section of a chemical coating station 700 of FIG. 7A which will be described below. In this embodiment, the network of cooling coils 210 are preferably suited to maintain the temperature of mounting plate 208 at a temperature that is slightly below room temperate ranging between about 14° C. and about 21° C., and more preferably between about 16° C. and 20° C., and most preferably between about 18° C. and 19° C. In this manner, suitable heat transfer will occur down from a warmer chuck 106 shown in FIG. 4.

Figure 7A:
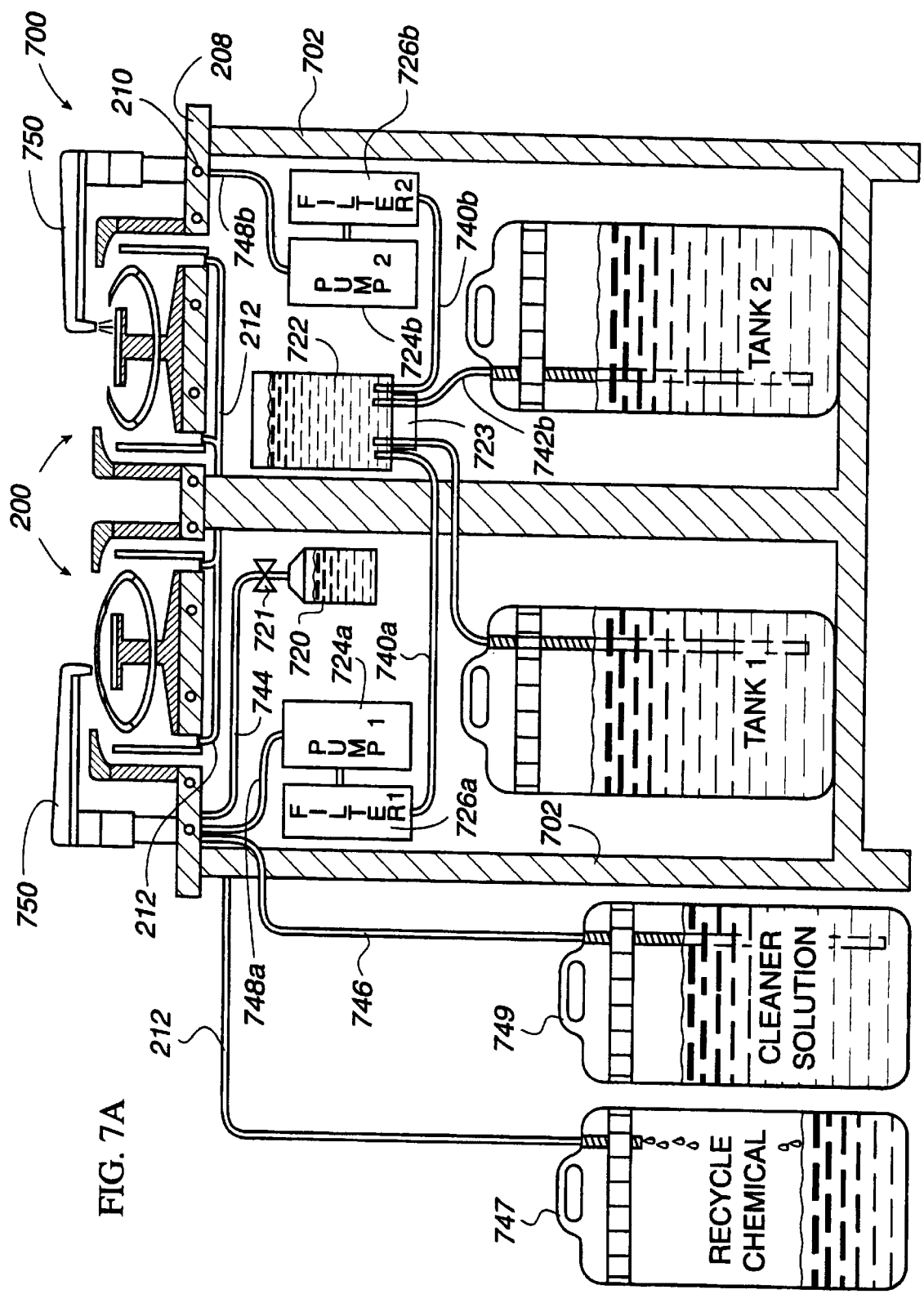
FIG. 7A is a diagrammatic representation of a chemical coating station in accordance with one embodiment of the present invention.

FIG. 7A is a diagrammatic representation of a chemical coating station 700 in accordance with one embodiment of the present invention. In this embodiment, the chemical coating station 700 preferably has an insulated wall and floor structure 702 that is preferably suited to insulate chemicals and components from outside ambient conditions. As described above, maintaining the solvent based chemicals contained in a TANK 1 and a TANK 2 at or slightly below room temperature, is an important aspect of the present invention. When the temperature is appropriately controlled through the cooling processes described above, the chemical coating process produces more uniform layers over disc 316. In this embodiment, a pair of process stations 200 are mounted to mounting plate 208 to increase the throughput of the chemical coating station 700.

To maintain the internal areas of the chemical coating station 700 at a constant temperature that is slightly below room temperature, the internal walls of the housing structure 702 are preferably provided with suitable cooling coils (shown in FIG. 7B below) that surround the internal walls around the chemicals contained within TANK 1, TANK 2, and a reservoir 722. As illustrated, a reservoir 722 preferably has sensor electronics 723 that is coupled to a pair of lines 742a and 742b leading to TANK 1 and TANK 2, respectively.

In this manner, sensor electronics 723 detect when either one of the two tanks are about to reach an empty state. By way of example, sensor electronics 723 may detect an empty state when line 742a or line 742b detects a slight air bubble coming from the internal region of TANKS 1 and TANKS 2. In a preferred embodiment, chemicals contained within a TANK 1 are used first and fed through line 742a to reservoir 722 for dispensing through one of the dispense arms 750. As shown, each dispense arm 750 is coupled to reservoir 722 to ensure that during a line-manufacturing coating process, chemicals at the required process temperatures are continuously available to dispense arms 750. By way of example, when an air bubble is detected by sensor electronics 723 coming from line 742a that leads to TANK 1, the sensor electronics 723 will detect that TANK 1 is nearly empty and a switch contained within sensor electronics 723 switches to TANK 2 through line 742b. In this manner, it is advantageous that the coating process does not need to be slowed down or stopped while the chemicals contained within TANK 1 are replaced are brought down to a suitable cool temperature.

By way of example, while suction was occurring through TANK 1, the chemicals in TANK 2 were maintained at a temperature that is slightly below room temperature by the aforementioned cooling coils contained within housing walls 702. Therefore, when TANK 1 is replaced, TANK 2 is already stabilized at a suitable process temperature. Further, once the chemicals contained in TANK 1 are replaced and placed back into housing 702, a insulated cover (not shown) may be placed over the front portion of housing 702 to ensure that the temperature within the housing is precisely controlled to reduce nonuniformities in the coating process.

It is further noted that once TANK 1 is replaced and slid back into housing 702, it is back in a temperature controlled unit. Accordingly, once TANK 2 reaches an empty state which is detected by an air bubble flowing through line 742b by sensor electronic 723, again the system will switch back to TANK 1 through line 742a. At this point, it is noted that TANK 1 is now sitting within housing 702 and ready for use. Accordingly, the process of switching back and forth between TANK 1 and TANK 2 allows the continuous coating processes to be uninterrupted. Further, the temperatures of the chemicals contained within TANK 1 and TANK 2 are always maintained at appropriate coating process temperature.

In this embodiment, chemicals pumped into reservoir 722 are preferably applied through dispense arm 750 through a filter and pump unit pair. As shown, lying on the lefthand side of the chemical coating station 700, is a filter 726a that is coupled to reservoir 722 via a line 740a. In this manner, the filter provides appropriate filtering of the solvent based chemicals to avoid introducing impurities or contaminants through dispense arm 750 during a coating application. Coupled to filter 726a is a pump 724a that is used to pump the chemicals from reservoir 722 up through a line 748a to dispense arm 750.

In a like manner, on the right side of the chemical coating station is a filter 726b which is connected to reservoir 722 via a line 740b. Filter 726b is likewise connected to pump 724b that is connected to dispense arm 750 via a line 748b. Accordingly, appropriate filtering and pumping of the chemicals from reservoir 722 are performed and applied through dispense arm 750 during operation. Further shown is a pipe 212 which is used to collect excess solvent based chemical being applied to a disc during a coating operation. This excess solvent based chemical is then passed out of the housing 702 to a tank 747.

In this embodiment tank 747 is used for recycling excess chemicals being applied at the coating stations. As described above, the solvent based chemicals may be very expensive chemicals that may be recycled. By way of example, the recycled solvent based chemicals may be shipped back to the manufacturer where the solvent based chemical is adjusted to appropriate solvent concentrations for appropriate re-use. In yet a further embodiment, dispense arms 750 are also equipped with a separate line 746 for applying a cleaner solution contained within a tank 749. Although the cleaner solution tank is not shown connected to the dispense arm on the right-hand side of the chemical coating station 700, it is assumed that suitable cleaning solutions may also be coupled to the dispense arm 750 on the right-hand side.

Furthermore, the chemical coating station 700 is equipped with a test chemical canister 720 having a valve 721 connected through a line 744 leading to dispense arm 750. The test chemical canister 720 is preferably used for applying new chemicals through the dispense arms without having to drain and waste expensive solvent based chemicals contained within reservoir 722. Further, having the separate test chemical canisters 720 eliminates the need for replacing (i.e., cleaning out) the filters and the pumps associated with applying the solvent based chemicals contained in TANK 1 and TANK 2. It should be noted that having test chemical canister 720 is an important feature which further allows a user to test chemicals in the coating stations without having to replace and drain reservoir 722.

As is well known in the art, when reservoir 722 is emptied and the filters and pumps are replaced, substantial amounts of the solvent based chemicals are wasted and may not be appropriately re-used. Further, replacement of the solvent based chemicals contained within reservoir 722 and the pumps and filters of the chemical coating station 700, further introduces downtime which may be unsuitable where throughput is an important feature of production. It should be noted that it is highly advantageous to implement side-by-side dual coating stations 200 and two dispense arms 750. Having this side-by-side arrangement allows for the simultaneous spin coating of discs which increases coating throughput.

By way of example, an entire coating process for a single disc may take about 16 seconds, however, by implementing the dual coating system, throughput speed may be increased to enable coating speeds up to about one disc per every 8 seconds. As can be appreciated, such throughputs have commercial advantages over single coating systems implemented in prior art designs.

Figure 7B:
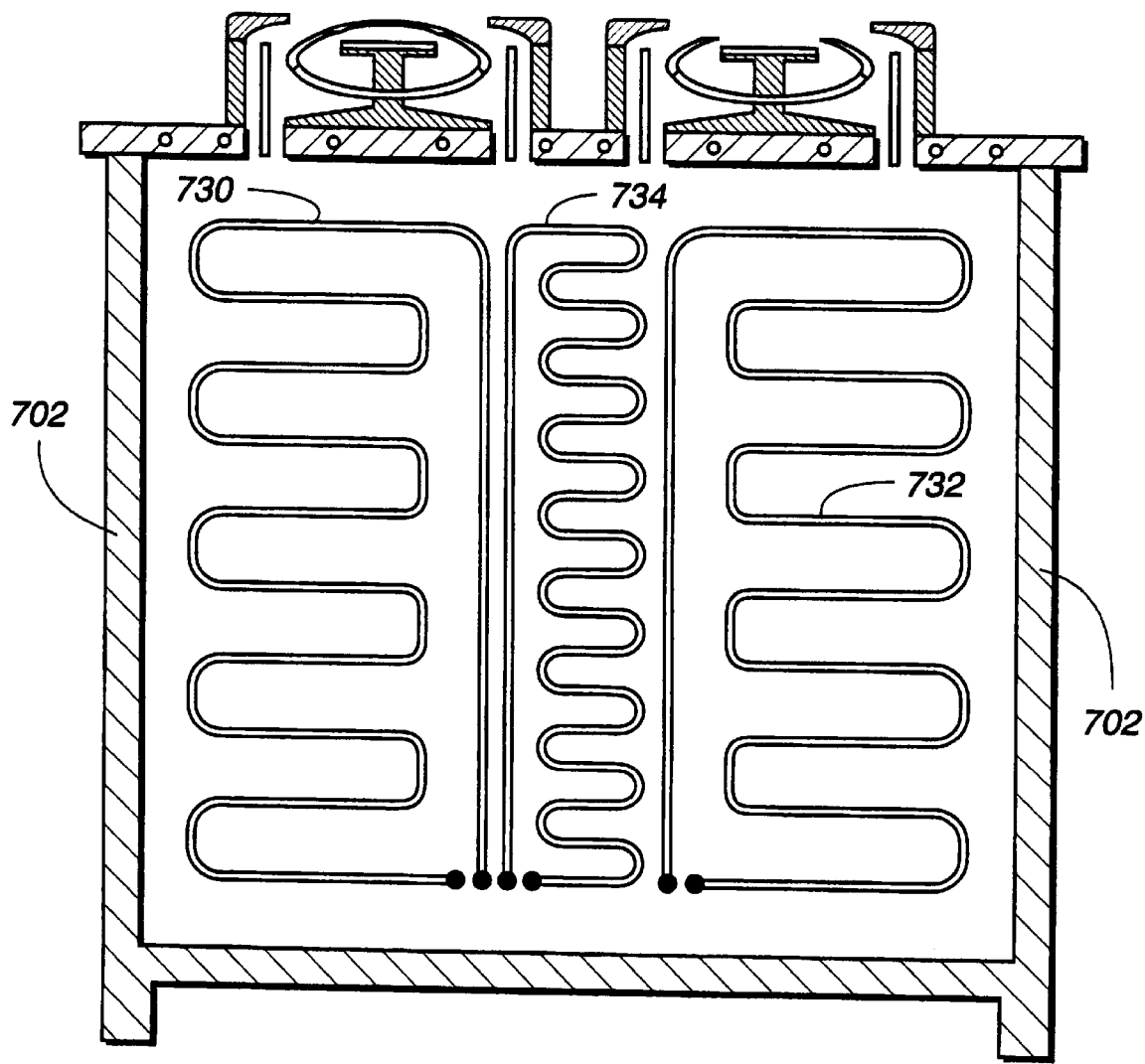
FIG. 7B illustrates the internal cooling system of the chemical coating station of FIG. 7A in accordance with one embodiment of the present invention.

FIG. 7B illustrates the internal cooling system of chemical coating station 700 of FIG. 7A in accordance with one embodiment of the present invention. As shown, the cooling system contained within the internal walls of the chemical coating station 700 are preferably copper cooling coils. As shown, there are preferably left side cooling coils 730, middle cooling coils 734 and right side cooling coils 732. As described above, the copper cooling coils contained within the internal walls of the chemical coating station 700 allow for precise temperature control of the chemicals stored within the housing structure 702.

Figure 7C:
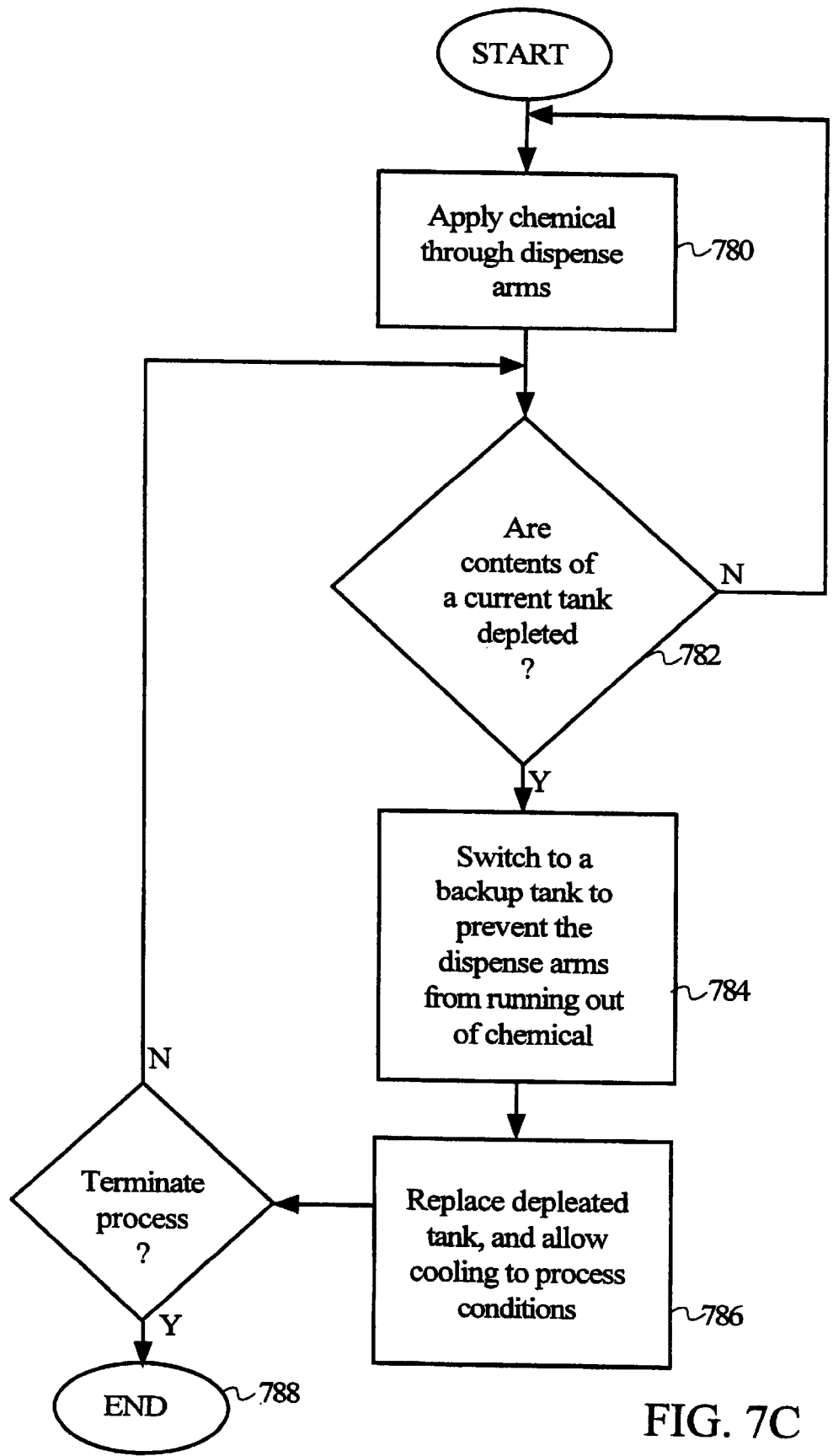
FIG. 7C is an overview flowchart diagram of the timing associated with monitoring and changing chemicals in TANKS 1 and 2 of FIG. 7A in accordance with one embodiment of the present invention.

FIG. 7C is an overview flowchart diagram of the timing associated with monitoring and changing chemicals in TANKS 1 and 2 of FIG. 7A in accordance with one embodiment of the present invention. The method begins at an operation 780 where chemicals are applied through dispense arms. Preferably, dispensing is performed through one dispense arm at one time, however, simultaneous dispensing may also be practiced. While chemicals are being applied through the dispense arms, chemicals are preferably being pulled from a current tank in a chemical application station. The method then proceeds to a decision operation 782 where it is determined whether the contents of the current tank are depleted.

By way of example, when a sensor detects that at least one air bubble is flowing through a line connected to the current tank, the sensor may determine that the first tank has become depleted of chemicals. If it is determined in operation 782 that the chemicals in the first tank are not depleted, then the method will proceed back to operation 780 where chemical application through the dispense arms continues. When it is determined in operation 782 that the chemicals in the first tank are depleted, the method will proceed to an operation 784 where a switch is made to the second tank contained within the chemical coating station. Once switched, the chemicals will now be drawn from a backup tank to prevent the dispense arms from running out of chemicals during a dispense operation.

The method now proceeds to an operation 786 where the depleted tank is replaced with fresh chemicals and allowed to cool to process conditions while dispensing is occurring through the backup tank in the chemical coating station. Accordingly, while the backup tank is being used for chemical application, the replaced tank is undergoing cooling to process conditions (which are preferably slightly below room temperature). The process then moves to a decision operation 788 where it is determined if the dispensing process should be terminated. If it is determined that the process should be terminated, the process will end.

On the other hand, the method will again proceed to decision operation 782. As such, the method will again determine if the contents of a current tank are depleted. If they are, the method will again proceed to operation 784 where a switch is performed to the backup tank to prevent the dispense arms from running out of chemicals. Of course, when the switch is made to the backup tank, the backup tank will have cooled down to the appropriate process conditions. Accordingly, the process will continue detecting the status of the tanks in use and replacing tanks while allowing the temperature of the replaced tank to be brought down to process temperature before being implemented in the chemical application station.

Figure 8A:
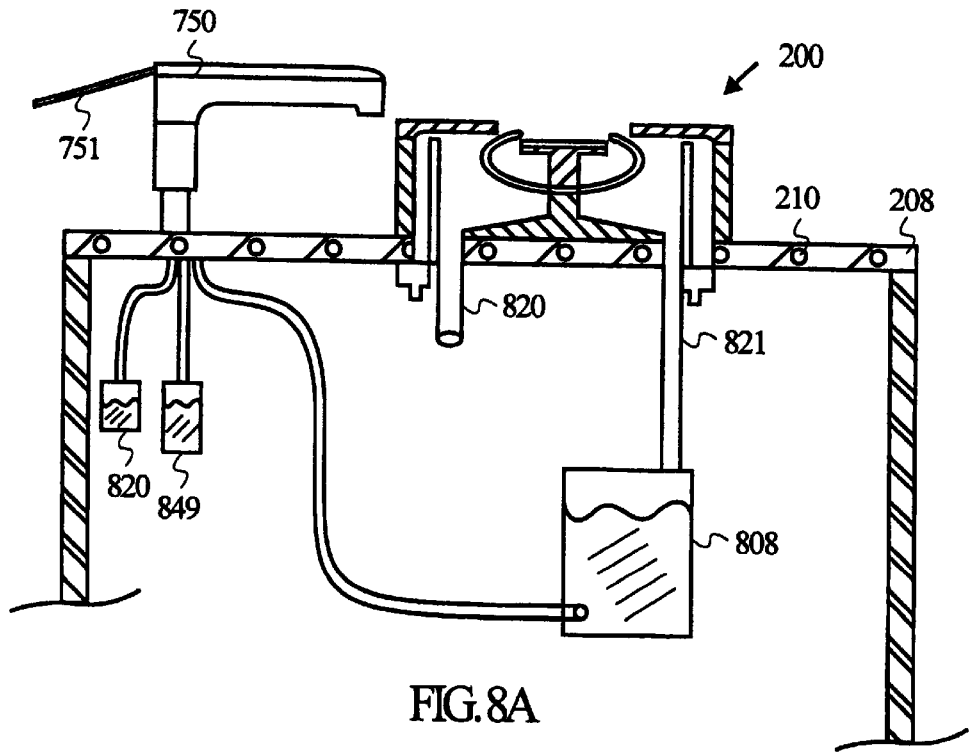
FIGS. 8A and 8B illustrate alternative embodiments for implementing a dispense arm in accordance with one embodiment of the present invention.
Figure 8B:
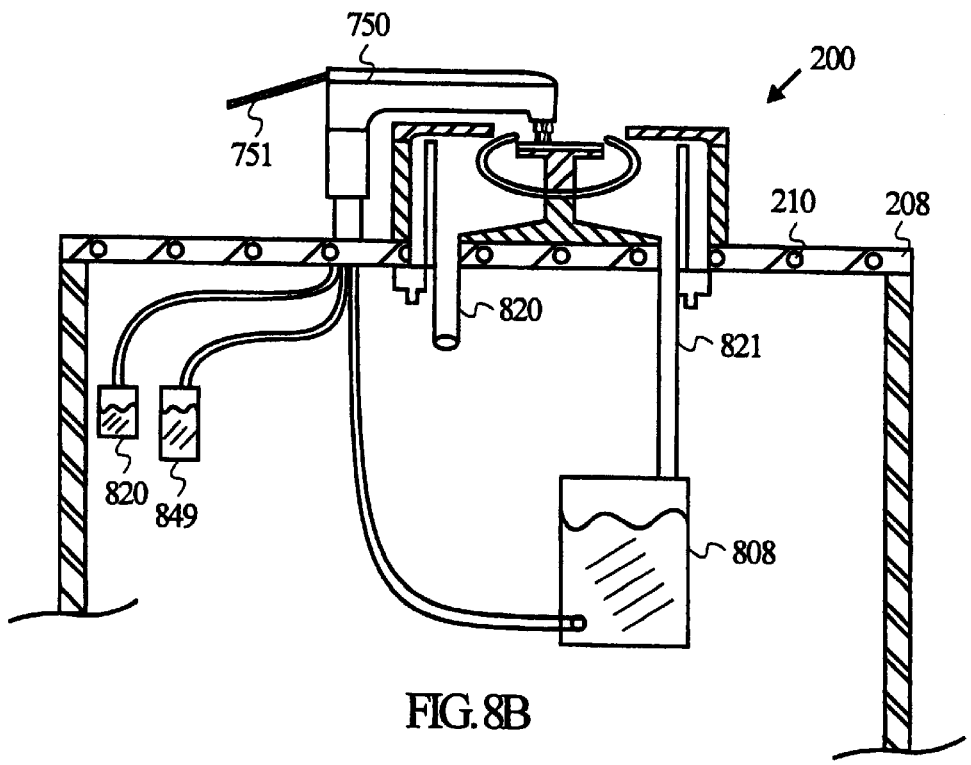

FIGS. 8A and 8B illustrate alternative embodiments for implementing a dispense arm 750 in accordance with one embodiment of the present invention. By way of example, FIG. 8A illustrates a dispense arm 750 having three feedlines coupled to a chemical tank 808, a cleaner container 849, and a test chemical container 820. As shown, a mounting plate having cooling coils 210 is used for mounting a process station 200. In operation, dispense arm 750 may be either moved mechanically towards (e.g., rotated to process station 200 from a fixed axis) process station 200 for applying one of the liquids connected to dispense arm 750.

As shown, dispense arm 750 preferably includes cooling coils 751 that are contained within a top cavity of dispense arm 750. The cooling cavity and the cooling coils contained within dispense arm 750 will be described in greater detail in FIGS. 9 and 10 below. By providing dispense arm 750 with its own cooling system, the chemicals being applied to the surface of a disc contained within process station 200 will be applied at the appropriate process temperature. Any excess chemicals applied over a disc in process station 200, may be funneled back into chemical tank 808 for re-use. Of course, if such re-use is performed, it may be necessary to recondition the chemical tank to bring it back up to its appropriate solvent concentration levels.

Although not shown, a separate concentration equilibrium tank may be used to bring the chemicals contained within chemical tank 808 to their appropriate concentration level before being funneled back in through dispense arm 750. Further, if application of a test chemical is desired, test chemical container 820 may be used to funnel chemicals to dispense arm 750. Such application may be performed using any suitable pump and filtering technique as described with reference to FIG. 7A.

FIG. 8B illustrates an embodiment where dispense arm 750 is rotated or moved towards process station 200. As shown, chemicals contained within chemical tank 808 or test chemical container 820 may be applied over the surface of a disc contained within process station 200. Alternatively, an appropriate cleaning solution contained within cleaner container 849 may be applied to the internal portions of process station 200 to clean the process station 200 after a coating session or before a new chemical is used.

FIG. 9 is an exploded diagram of a temperature controlled dispense arm 750 in accordance with one embodiment of the present invention. As shown, dispense arm 750 includes a base portion 906 having a plurality of channels which include channels 908, 910 and 912 for routing separate dispensing lines as described with reference to FIGS. 8A and 8B. As an example, a shaft 926 is preferably a pipe fixture that contains a plurality of flexible Teflon lines that curve up to the topmost surface of the base portion 906.

In this embodiment, shaft 926 is shown having three lines, 926a, 926b, and 926c that may be used for dispensing a primary chemical, a secondary chemical, and a cleaner. Lines 926a, 926b, and 926c preferably have an inter diameter of about 4 mm to ensure suitable application of varying viscosity chemicals through dispense arm 750. Of course, any suitable number of chemical lines may be passed through shaft 926. Shaft 926 is preferably connected to a collar 924, which is an adjustable collar for positioning dispense arm 750 upwards or downwards with respect to a mounting plate 208 (as shown in FIG. 3A). Coupled to collar 924 is a mounting block 930 that is preferably coupled to the base portion 906 by a suitable pin (not shown) that allows vertical movement of the dispensing end (i.e., the front end) relative to the rear end of base portion 906 near mounting block 930.

Further, a cam 920 which is of a semi-circular shape, is placed below base portion 906. As shown, cam 920 is in direct contact with a bearing 922 that is attached an under lip 931 of the base portion 906. In this manner, base portion 906 is pivoted about shaft 926 and rotationally moves along cam 920. In a preferred embodiment, cam 920 has a portion which is vertically higher than other portions. The vertically higher region is used to elevate dispense arm 750 when it is rotated over the process station 200. Through this elevation, dispense arm 750 is raised to avoid contact with process bowl 202 as shown in FIG. 3A. Also illustrated is the exemplary continuation of line 926a which is preferably a flexible Teflon pipe that is connected to a coupler 928. The coupler 928 is preferably used to connect down to a stainless steel pipe 927 which is run within channel 908.

In one embodiment, stainless steel pipe 927 preferably has inner diameters ranging between about 1 mm and about 2 mm, depending on the viscosity of chemicals being applied through dispense arm 750. Although not shown for ease of illustration, a similar dispense line 926b and 926c will be run up through collar 924, mounting block 930, through the base portion 906, and then fit in along channels 910 and 912. Once the lines are properly channeled in the respective channels 908, 910 and 912, a dispense line separator 904 is preferably secured down to the front region of base portion 906. In this embodiment, dispense line separator 904 is preferably used to hold in place the various stainless steel pipes which are fit in channels 908, 910 and 912.

Once dispense line separator 904 has been secured to the front region of base portion 906, holding in place the various dispense lines, a cooling plate 902 is secured to the topmost portion of dispense line separator 904 as well as base portion 906. As will be described in more detail below, cooling plate 902 preferably includes copper cooling coils which are suited for running cooling fluids to ensure that chemicals being dispensed are dispensed at a proper dispensing temperature.

Figure 10:
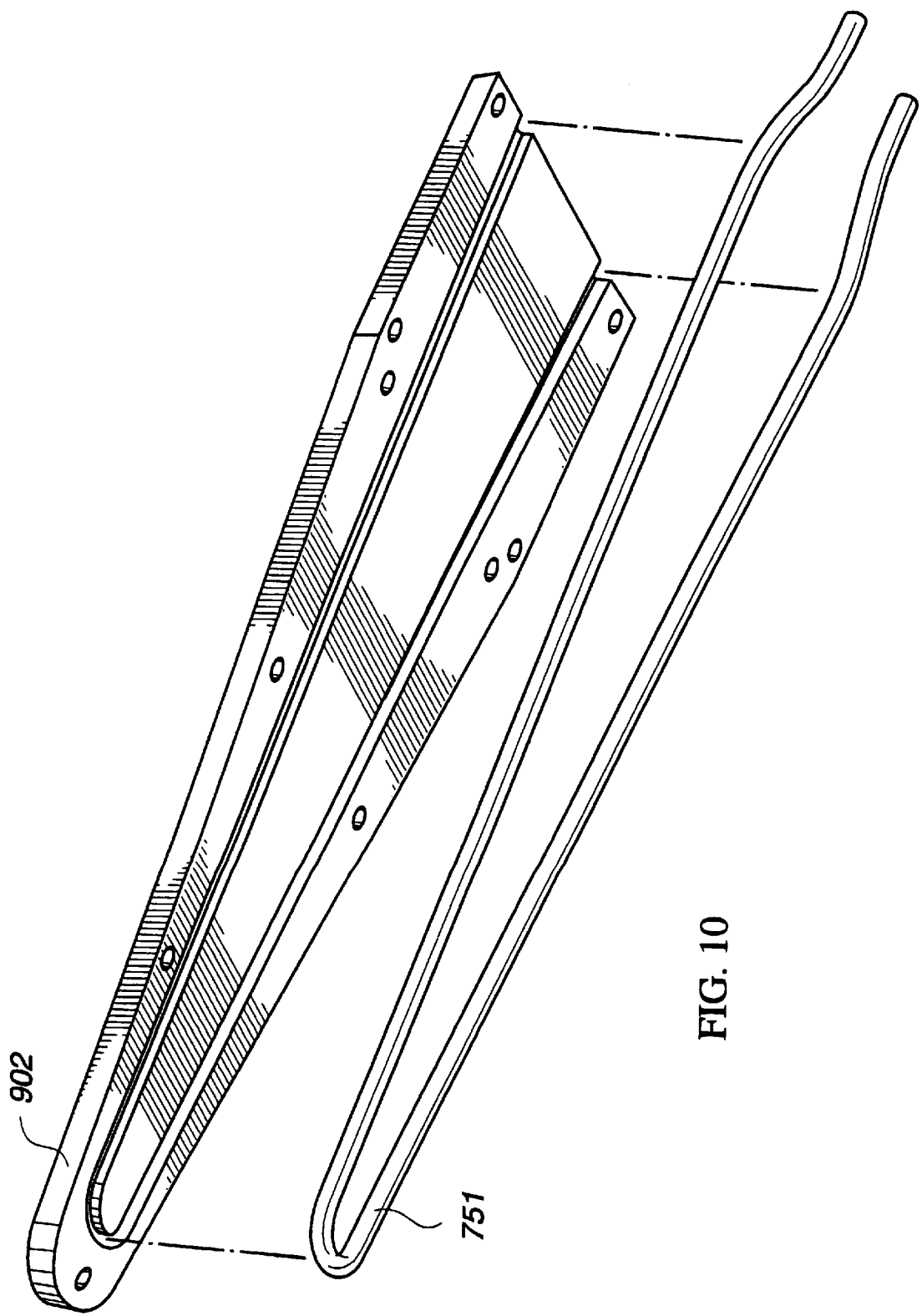
FIG. 10 is an exploded diagram of cooling plate 902 of FIG. 9 in accordance with one embodiment of the present invention.

FIG. 10 is an exploded diagram of cooling plate 902 of FIG. 9 in accordance with one embodiment of the present invention. As shown, cooling plate 902 preferably has an inset groove which is suited to receive cooling coils 751. Once cooling coils 751 are inset into cooling plate 902, cooling plate 902 may be set down onto and over dispense line separator 904 as well as center portions of base portion 906. It should be appreciated that maintaining the process temperature of the chemicals being applied through dispense arm 750 is a major improvement over prior art dispensers which merely funnel chemicals to a process station. Consequently, maintaining the temperature of the chemicals at about room temperature or slightly below is an important feature that reduces premature evaporation of the solvent materials applied through dispense arm 750 and also controls the viscosity of the solvent based chemical when it is applied to the disc.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A temperature controlled dispense arm for dispensing chemicals in a spin coating machine, wherein the temperature controlled dispense arm comprises:

a dispense arm cooling plate, the dispense arm cooling plate being made of a thermally conductive material;

a dispense arm base having at least one chemical dispensing passage, the at least one chemical dispensing passage being thermally coupled to the dispense arm cooling plate; and a cooling coil for cooling the dispense arm cooling plate the cooling coil being located in the dispense arm cooling plate;

whereby the at least one chemical dispensing passage is maintained at a cooled temperature determined by the cooling coil for cooling the dispense arm cooling plate.

2. A temperature controlled dispense arm for dispensing chemicals in a spin coating machine as recited in claim 1, wherein the cooled temperature is between about 16 degrees Celsius and about 21 degrees Celsius.

3. A temperature controlled dispense arm for dispensing chemicals in a spin coating machine as recited in claim 1, wherein the at least one chemical dispensing passage of the dispense arm base is configured to hold a thermally conductive pipe that is directly cooled by the dispense arm cooling plate such that a chemical being dispensed through the thermally conductive pipe is maintained at the cooled temperature.

4. A temperature controlled dispense arm for dispensing chemicals in a spin coating machine as recited in claim 3, wherein the dispense arm base includes a first thermally conductive pipe, a second thermally conductive pipe and a third thermally conductive pipe.

5. A temperature controlled dispense arm for dispensing chemicals in a spin coating machine as recited in claim 4, wherein the first thermally conductive pipe is used to dispense a first chemical, the second thermally conductive pipe is used to dispense a test chemical, and the third thermally conductive pipe is used to dispense a cleaner.

6. A temperature controlled dispense arm for dispensing chemicals in a spin coating machine as recited in claim 5, wherein a housing structure including liquid cooled walls is used to maintain a primary tank, a backup tank and a test tank at the cooled temperature, and further comprising:

a liquid cooled top plate that is thermally coupled to the temperature controlled dispense arm.

7. A temperature controlled dispense arm for dispensing chemicals in a spin coating machine as recited in claim 6, wherein the temperature controlled dispense arm is configured to apply one of the first chemical, the test chemical and the cleaner to a substrate that is held on a temperature controlled chuck;

whereby the temperature controlled chuck is controlled by the liquid cooled top plate of the housing structure.

8. A temperature controlled dispense arm for dispensing chemicals in a spin coating machine as recited in claim 7, wherein the housing structure includes two dispensing systems;

wherein each dispensing system includes a temperature controlled chuck and a temperature controlled dispense arm.

9. A temperature controlled dispense arm for dispensing chemicals in a spin coating machine as recited in claim 8, wherein a chemical coating throughput of the two dispensing systems is about one disc per about eight seconds.

10. A temperature controlled dispense arm for dispensing chemicals in a spin coating machine, wherein the temperature controlled dispense arm comprises:

a dispense arm cooling portion;

a dispense arm base portion having at least one chemical dispensing passage, the at least one chemical dispensing passage being thermally coupled to the dispense arm cooling portion; and a cooling coil contained within the dispense arm cooling portion, and the dispense arm cooling portion being coupled to the dispense arm base portion.

11. A temperature controlled dispense arm for dispensing chemicals in a spin coating machine as recited in claim 10, wherein the at least one chemical dispensing passage is maintained at a cooled temperature determined by the cooling coil for cooling the dispense arm cooling portion.

12. A temperature controlled dispense arm for dispensing chemicals in a spin coating machine as recited in claim 10, wherein the cooling coil is located in an a groove in the dispense arm cooling portion.

13. A temperature controlled dispense arm for dispensing chemicals in a spin coating machine as recited in claim 10, wherein the cooled temperature is between about 14 degrees Celsius and about 21 degrees Celsius.

14. A temperature controlled dispense arm for dispensing chemicals in a spin coating machine as recited in claim 10, wherein the at least one chemical dispensing passage of the dispense arm base portion is configured to hold a thermally conductive pipe that is directly cooled by the dispense arm cooling portion such that a chemical being dispensed through the thermally conductive pipe is maintained at the cooled temperature.

15. A temperature controlled dispense arm for dispensing chemicals in a spin coating machine as recited in claim 10, wherein the dispense arm base portion includes a first thermally conductive pipe, a second thermally conductive pipe and a third thermally conductive pipe.

16. A temperature controlled dispense arm for dispensing chemicals in a spin coating machine, wherein the temperature controlled dispense arm comprises:

a cooling coil for cooling the dispense arm; and a dispense arm base portion having at least one chemical dispensing passage, the at least one chemical dispensing passage being thermally coupled to the cooling coil, whereby the at least one chemical dispensing passage is maintained at a cooled temperature determined by the cooling coil, and the cooling coil is defined within a dispense arm cooling plate that is connected to the dispense arm base portion.

17. A temperature controlled dispense arm for dispensing chemicals in a spin coating machine as recited in claim 16, wherein the cooled temperature is between about 14 degrees Celsius and about 21 degrees Celsius.

18. A temperature controlled dispense arm for dispensing chemicals in a spin coating machine as recited in claim 16, wherein the at least one chemical dispensing passage of the dispense arm base portion is configured to hold a thermally conductive pipe that is cooled by the cooling coil such that a chemical being dispensed through the thermally conductive pipe is maintained at the cooled temperature.

* * * * *